(12) United States Patent
Manvar et al.

(10) Patent No.: US 10,620,859 B2
(45) Date of Patent: Apr. 14, 2020

(54) NVDIMM METADATA

(71) Applicant: HEWLETT PACKARD ENTERPRISE DEVELOPMENT LP, Houston, TX (US)

(72) Inventors: Viratkumar Maganlal Manvar, Bangalore (IN); Frank Wu, Houston, TX (US); Robert C Elliott, Houston, TX (US); Robert J Volentine, Houston, TX (US)

(73) Assignee: HEWLETT PACKARD ENTERPRISE DEVELOPMENT LP, Houston, TX (US)

(*) Notice: Subject to any disclaimer, the term of this patent is extended or adjusted under 35 U.S.C. 154(b) by 167 days.

(21) Appl. No.: 15/717,915

(22) Filed: Sep. 27, 2017

(65) Prior Publication Data

US 2018/0095691 A1    Apr. 5, 2018

(30) Foreign Application Priority Data

Sep. 30, 2016   (IN) .............................. 201641033603

(51) Int. Cl.
| | |
|---|---|
| *G06F 13/00* | (2006.01) |
| *G06F 3/06* | (2006.01) |
| *G06F 13/16* | (2006.01) |
| *G11C 5/04* | (2006.01) |

(52) U.S. Cl.
CPC .......... *G06F 3/0632* (2013.01); *G06F 3/0604* (2013.01); *G06F 3/0679* (2013.01); *G06F 13/16* (2013.01); *G06F 13/1694* (2013.01); *G11C 5/04* (2013.01)

(58) Field of Classification Search
CPC ...... G06F 3/0632; G06F 3/0679; G06F 13/16; G06F 13/1694; G06F 3/0604
See application file for complete search history.

(56) References Cited

U.S. PATENT DOCUMENTS

| | | | | |
|---|---|---|---|---|
| 2004/0268106 A1* | 12/2004 | Holmberg | ................. | G06F 8/65 713/1 |
| 2006/0206675 A1* | 9/2006 | Sato | ...................... | G06F 3/0607 711/161 |
| 2012/0311249 A1* | 12/2012 | Koya | ...................... | G06F 12/00 711/105 |
| 2016/0011802 A1* | 1/2016 | Berke | ................... | G06F 3/0619 711/166 |
| 2018/0075069 A1* | 3/2018 | Guim Bernat | ...... | H04L 67/2852 |

* cited by examiner

*Primary Examiner* — Charles Rones
*Assistant Examiner* — Han V Doan
(74) *Attorney, Agent, or Firm* — Hewlett Packard Enterprise Patent Department

(57) ABSTRACT

In one example in accordance with the present disclosure, a device comprising a host computing device further comprises a processor, a non-volatile dual inline memory module (NVDIMM) comprising metadata indicating system configuration information associated with the NVDIMM, and a basic input output system (BIOS) comprising system configuration information associated with the host computing device. The BIOS may: determine whether there is a mismatch between the system configuration information of the host computing device and the system configuration information indicated by the metadata.

17 Claims, 7 Drawing Sheets

നVDIMM METADATA

BACKGROUND

A computing system may comprise a non-volatile dual inline memory module (NVDIMM). The NVDIMM may retain data in the event of power loss.

BRIEF DESCRIPTION OF THE DRAWINGS

The following detailed description references the drawings, wherein.

DETAILED DESCRIPTION

Figure 1:
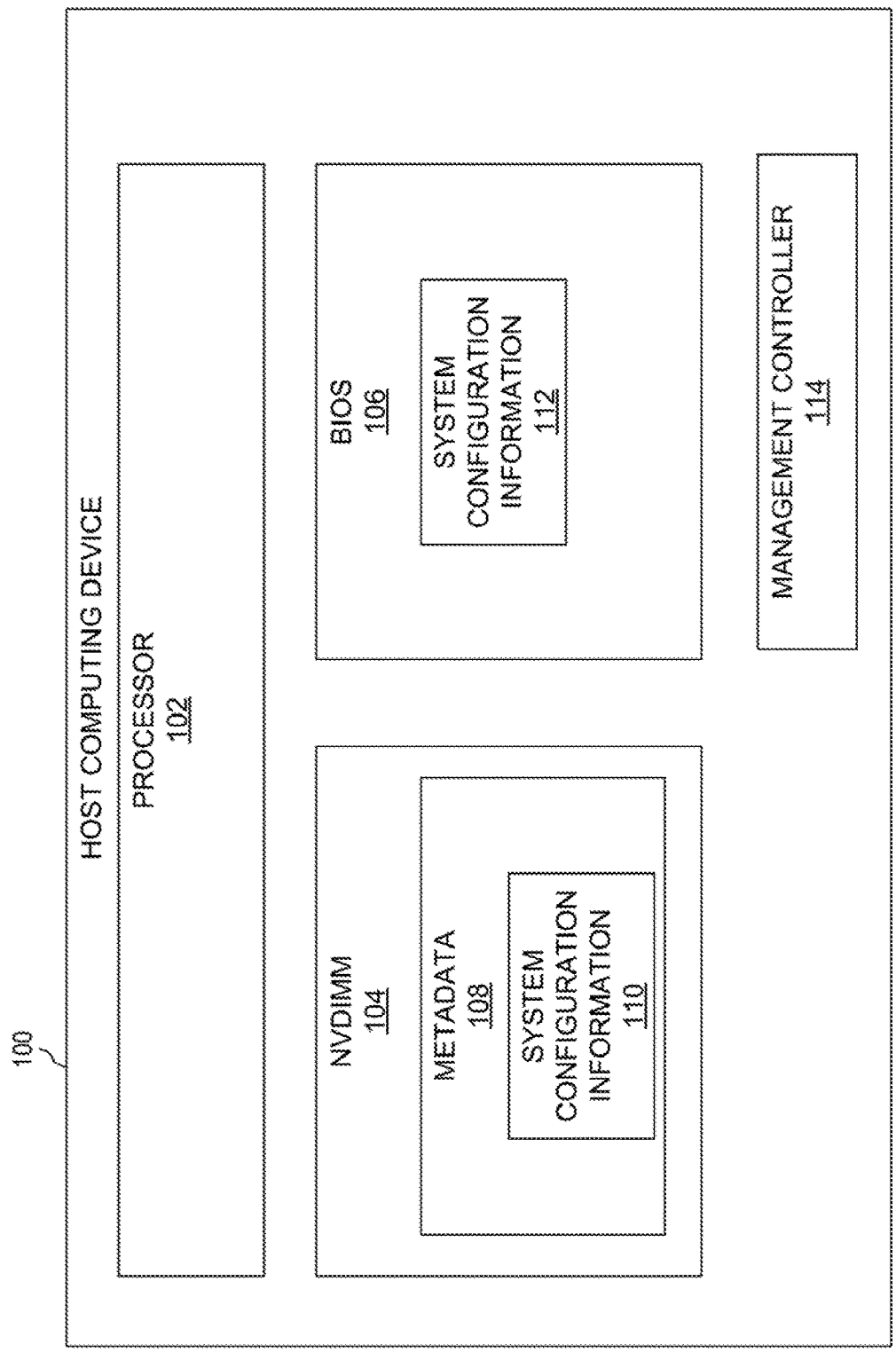
FIG. 1 is a block diagram of an example computing system for migrating NVDIMMs.

Non-volatile dual inline memory modules (NVDIMMs) are non-volatile memory devices. An NVDIMM retains stored data in the event of power loss or system failure. One advantage of an NVDIMM is that if a system or component fails, the NVDIMM can be migrated to another memory slot in the same system or to a different system entirely and the data stored on the NVDIMM can be retrieved.

However, there are issues associated with migrating an NVDIMM from one slot to another or from one system to another. These migration issues, which may be caused by mismatches in system configuration settings, may cause system crashes, instability, or corruption of the data stored on the NVDIMM. As examples, moving an NVDIMM to another slot may change the order of which the NVDIMM is accessed relative to other DIMMs in the system, which may cause issues such as those described above. Additionally, migrating an NVDIMM to another system may cause issues if the system uses a different processor, chipset, memory interleaving scheme, ways of channel interleaving, ways of node interleaving, ways of rank interleaving, or the like.

To address issues associated with migrating an NVDIMM, the system BIOS (basic input output system) and/or a management controller described herein may comprise firmware to read metadata stored on an NVDIMM. The metadata indicates information about the system in which the NVDIMM last properly installed or booted. NVDIMM stores the metadata in scratch space of the NVDIMM.

As used herein, a management processor can include a hardware processor that is dedicated to management of the computing device. The processor may execute in a separate or isolated manner from the main processor of the computing system. An example of a management processor can include a baseboard management controller (BMC), which is a specialized microcontroller embedded on a motherboard of a computing device such as a server.

A BMC can support the Intelligent Platform Management Interface (IPMI) architecture, which defines a set of common interfaces to computer hardware and firmware that system administrators can use to monitor health and manage a computing device. A BMC can manage the interface between system management software and hardware of the computing device.

In various examples, a BMC of a computing device can provide remote management access to the computing device, and may provide such remote management access over an out-of-band communication channel, which isolates management communication from communication of an operating system (OS) running on the computing device. In some instances, the BMC may enable lights-out management of the computing device, which provides remote management access (e.g., system console access) to the computing device regardless of whether the computing device is powered on, whether a primary network subsystem hardware is functioning, or whether an OS is operating or even installed.

The metadata stored on the NVDIMM comprises a table of information related to platform configuration settings, platform identification details, and NVDIMM identification details. At boot time, the BIOS and/and/or management controller of a host computing device reads the metadata. Based on the values of fields in the metadata, the system BIOS and/and/or management controller determines whether there is a mismatch between the system settings indicated by the NVDIMM metadata, and the system settings that the host system utilizes.

If there is not a mismatch between the metadata and the system configuration settings of the host system, the system BIOS allows the host system to access the NVDIMM normally. If the system BIOS detects a mismatch, the system BIOS and/or management controller may prompt a user of the host system to address the system settings which are in conflict. If user changes the system settings to address the mismatch, the host system may utilize the NVDIMM normally. If the mismatch is not resolved, the system BIOS and/or management controller disables access to the NVDIMM to prevent data corruption or misinterpretation of data saved on the NVDIMM.

In some examples, not all settings must match perfectly, i.e. some mismatches may be permissible for the BIOS and/or management controller to permit the host system to access the migrated NVDIMM. In such cases where mismatch is tolerable, the system BIOS and/or management controller may also adjust metadata structures stored in system configuration data of the BIOS and/or management controller to utilize the present host system configuration during operation.

FIG. 1 is a block diagram of an example computing device 100 for migrating NVDIMMs. Host computing device 100 may be any computing system or computing device capable of using non-volatile memory. Host computing device 100 may include at least one processor 102, an NVDIMM 104, BIOS (basic input output system) 106, and/or a management controller 114. Processor 102 may be coupled with NVDIMM 104, e.g. via a memory controller (not pictured).

Management controller 114 may allow remote administrative access and control of host computing device 100. Management controller 114 may provide so-called lights out functionality.

Processor 102 may execute BIOS 106, e.g. at system boot time. At least one of BIOS 106 and/or management controller 114 may store system configuration information 112. System configuration information 112 may comprise platform configuration information, platform identification details, and NVDIMM identification details, as some non-limiting examples. System configuration information 112 will be described in greater detail herein.

At boot time, BIOS 106 and/or management controller 114 may identify and enumerate onboard and peripheral devices that comprise and/or are coupled to host computing device 100 to ensure proper operation of host computing device 100. For example, BIOS 106 and/or management controller 114 may identify and enumerate processor(s), disk drives, memory, peripherals, and chipsets comprising host computing device 100

In the example of FIG. 1, as part of detecting memory devices, BIOS 106 and/or management controller 114 may determine that an NVDIMM, such as NVDIMM 104 is coupled to host computing device 100. Although only a single NVDIMM is illustrated in FIG. 1, NVDIMM 104 may comprise a plurality of NVDIMMs.

In some examples, an administrator may migrate an NVDIMM from another computing device to host computing device 100, or from one memory slot to another memory slot of host computing device 100. The NVDIMM may be migrated for example, in the event of a system hardware failure. However, in various examples the migrated NVDIMM may be configured to operate in a particular system configuration. As will be described in greater detail, the system configuration information may comprise information such as platform configuration settings, platform identification details, and NVDIMM identification details, as some non-limiting examples. If the NVDIMM is migrated to a system or memory slot that would result in an incompatible memory configuration, accessing the contents of NVDIMM 104 may cause data corruption.

If the NVDIMM is migrated from a system having first system configuration settings, to a second computing device having a different, incompatible system configuration, a host computing device attempting to access the data stored on the NVDIMM may misinterpret or corrupt the data stored on the NVDIMM. The techniques of this disclosure allow migration of an NVDIMM based on system configuration data stored on the NVDIMM.

In the example of FIG. 1, NVDIMM 104 comprises metadata 108. Metadata 108 may be stored in a separate physical or logical area of NVDIMM 104 from the normally addressable address range associated with NVDIMM 104. In various examples, metadata 108 may be stored in a dedicated EEPROM of NVDIMM 104. The EEPROM may be accessible by BIOS 106 and/and/or management controller 114.

Each NVDIMM has its own separate associated metadata. Thus, metadata 108 comprises system configuration information 110 indicates information associated with a system in which NVDIMM 104 was previously used. In some examples, the previous system may comprise host computing device 100, e.g. if NVDIMM 104 was moved within host computing device 100 (e.g. from one memory slot to another, or from one node to another). System configuration information 110 may generally comprise a table comprising a plurality of entries. Each table entry corresponds to a particular setting value, and is addressable at a corresponding byte offset. During boot time, (e.g. a power-on self-test, referred to as a POST), BIOS 106 and/or management controller 114 may read the contents of system configuration information 110 for each NVDIMM. In various examples, system configuration information 110 may comprise a version of metadata 108. The version of metadata 108 may indicate which fields are present in system configuration information 110. If the version of metadata 108 is newer than the version of metadata supported by BIOS 106 and/or management controller 114, system configuration information 110 may comprise additional fields that BIOS 106 and/or management controller 114 does not support, and BIOS 106 and/or management controller 114 may ignore those additional fields. In the case that BIOS 106 and/or management controller 114 support additional fields not supported (or not present) by NVDIMM 104, BIOS 106 and/or management controller 114 may ignore the additional fields stored in system configuration 112.

System configuration information 110 may also comprise header information that indicates sizes and/or byte offsets of each field in the table. For example, the header information may indicate that a particular field, such as a DIMM slot location, is located at a particular offset relative to a base address. The header information may also indicate a size of that field in byte(s). System configuration information 110 may also comprise at least one cyclic redundancy check (CRC). BIOS 106 and/or management controller 114 may use the CRC to make sure that system configuration information 110 is not corrupt.

The table of system configuration information 110 may further comprise platform configuration settings, platform identification details, and NVDIMM identification details, as non-limiting examples. Platform configuration settings may comprise information related to the platform associated with the configuration of NVDIMM 104. As examples, platform configuration settings may comprise fields that indicate: data scrambling, a data scrambling seed (if any), an interleaving setting, a cluster on die setting, a wayness of channel interleaving, a wayness of node (e.g. socket) interleaving, and/or a wayness of rank interleaving, as non-limiting examples.

Wayness, as described herein, defines a number of "ways" amongst which memory requests are interleaved across a number of sockets, ranks, memory channels, etc. For examples, two-way channel interleaving describes interleaving memory requests across two channels to increase memory access performance. Two-way rank interleaving describes interleaving memory requests across two banks.

Data scrambling indicates whether memory addresses and/or values associated with an NVDIMM are continually remapped for signal integrity purposes. The data scrambling seed indicates a seed value used to perform the data scrambling for the associated NVDIMM.

Interleaving settings indicate whether any type of interleaving is enabled for the associated NVDIMM. The value of the wayness of channel interleaving indicates how many other memory channels the memory requests are spread (e.g. alternated) across. The value of the cluster on die setting indicates whether interleaving is enabled for NVDIMMs at the socket level, or at a memory controller level. The value of the wayness of node (e.g. socket) interleaving and wayness of rank interleaving settings indicates the number of nodes (and/or sockets) among which NVDIMM access requests are interleaved, and the number of ranks in a memory channel across which memory access requests are interleaved, respectively.

The platform identification settings may comprise the following fields: a platform ID, processor ID, processor SKU number, as non-limiting examples. The platform ID may comprise a unique identification number and/or string that identifies a platform type. The platform ID may be vendor-specific. The value of the processor ID field may indicate the type of processor associated with the NVDIMM, and may be equal to the value returned from the CPUID instruction on x86 processors in some examples. For non-x86 processors, other methods may be used to determine the value of the processor ID the Processor SKU number may be a manufacture-specific stock keeping unit number.

In various examples, the platform identification settings may comprise fields which indicate, a memory controller PCI (peripheral component interconnect) device ID and Vendor ID, a chipset PCI Device ID and Vendor ID, and/or a number of memory controllers per processor chip, as non-limiting examples. The PCI and vendor ID fields may correspond to values supplied by the PCI special interest group (PCI SIG).

The NVDIMM identification settings may comprise fields that indicate: a system GUID (global unique identifier) associated with the NVDIMM, a set GUID associated with the NVDIMM, a DIMM slot location of the associated NVDIMM, and a total number of NVDIMMs in an interleaved set of NVDIMMs. The system GUID may be a GUID that platform firmware assigns to all NVDIMMs in a particular system. When moving the NVDIMM to a new system, the NVDIMM in the existing system may retain its existing GUID, while NVDIMMs from the migrated system may have a different GUID.

The set GUID may be assigned to all NVDIMMs in an interleaved set. The set GUID of an NVDIMM may differ relative to other NVDIMMs in the interleaved set when an NVDIMM is migrated to a different cluster, computing device, or memory slot. The DIMM slot value indicates a memory slot where the associated NVDIMM was last installed.

In various examples, the NVDIMM identification settings may further comprise fields that indicate: an NVDIMM interleaved set bit mask, and/or a rank address of an NVDIMM in a channel. The value of the NVDIMM interleaved set bit mask field comprises a bitmask of slots where NVDIMMs are present in an interleaved set containing the associated NVDIMM. BIOS 106 and/or management controller 114 may determine whether NVDIMMs are absent from an interleaved set based on the bitmask value, as well as memory slot location(s) of an interleaved set from which NVDIMMs are absent and should be installed to complete an interleaved set.

The value of the rank address of an NVDIMM in a channel field indicates the total number of ranks present in a channel before that particular NVDIMM. Ranks are counted starting at the DIMM/NVDIMM in slot 0, and increasing with each subsequent slot number in a memory channel. For example, The NVDIMM located at channel 0, DIMM slot 1, may have a rank address of 2 if there is a dual rank (2 ranks) DIMM/NVDIMM present in DIMM slot 0. The rank address of an NVDIMM may vary based on the number of ranks present in each DIMM/NVDIMM in a channel.

BIOS 106 and/and/or management controller 114 stores system configuration information 112. System configuration information 112 comprises information about the configuration(s) of host computing device 100. At boot time (e.g. POST), BIOS 106 and/and/or management controller 114 compares system configuration information 110 of each of NVDIMMs 104 against the values stored in system configuration information 112 to determine whether there is a configuration mismatch, and/or a configuration incompatibility.

Some mismatches in values between system configuration information 112 and system configuration information 110 may be tolerable, and some may be intolerable. BIOS 106 and/or management controller 114 may report any potential incompatibilities to a user of host computing device 100. As examples, a mismatch between platform configuration settings may be intolerable. For example, if NVDIMM 104 is being migrated to a system or slot having different interleaving settings or memory scrambling settings would result in data corruption. In these cases of incompatibility, BIOS 106 and/or management controller 114 may report the incompatibility to the user and may disable NVDIMM 104 to prevent corruption of data stored on NVDIMM 104.

Some mismatches in values of platform identification details may be tolerable, while some other mismatches in platform identification detail values may be intolerable. In various examples, if an NVDIMM is migrated to a system having an incompatible processor type, BIOS 106 and/or management controller 114 may report the intolerable mismatch, and disable access to NVDIMM 104. However, migrating NVDIMM 104 from, e.g. an Intel processor having a Haswell microarchitecture to a processor having a Broadwell microarchitecture may be tolerable, and the user may or may not be alerted to the setting mismatch.

In various examples, a mismatch in system GUID values may be tolerable. In this case, BIOS 106 and/or management controller 114 may determine that system configuration information 110 of NVDIMM 104 has a different system GUID relative to the system GUID stored in system configuration information 112. BIOS 106 and/or management controller 114 may alert the user to the mismatch but may still permit access to NVDIMM 104.

Some other mismatches of NVDIMM settings values may be intolerable. As examples, if interleaved set validation will fail, which may be based on BIOS 106 and/or management controller 114 determining mismatches between set GUIDs, NVDIMM interleaved set bitmask, and/or the total number of NVDIMMs in the interleaved set, BIOS 106 and/or management controller 114 may prohibit access to the contents of NVDIMM 104. BIOS 106 and/or management controller 114 may prohibit access to the contents of NVDIMM 104 to prevent the corruption of data stored on NVDIMM 104. BIOS 106 and/or management controller 114 may report the mismatch error to the user, e.g. during boot of host computing device 100. Similarly, if there is a mismatch between the data scrambling, rank address settings of system configuration information 110, BIOS 106 and/or management controller 114 may disable access to NVDIMM 104, and prompt the user to address the mismatch.

If a user resolves an NVDIMM metadata mismatch, e.g. by moving an NVDIMM, changing a setting of BIOS 106 and/or management controller 114 related to NVDIMM 104, or the like, BIOS 106 and/or management controller 114 may allow host computing device 100 to access NVDIMM 104. In the event that a mismatch is tolerable but not resolved, BIOS 106 and/or management controller 114 may also allow access to the data stored on NVDIMM 104.

Figure 2:
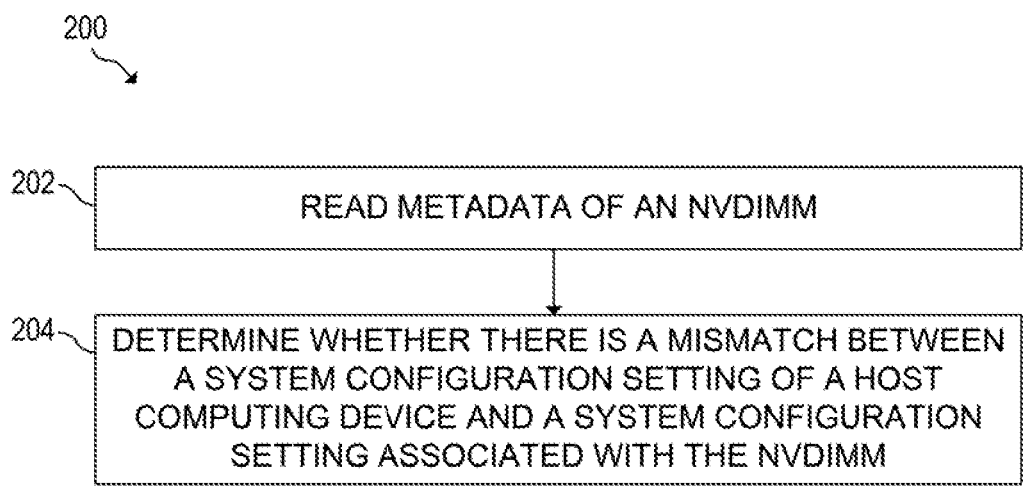
FIG. 2 is a flowchart of an example method for migrating NVDIMMs.

FIG. 2 is a flowchart of an example method 200 for migrating NVDIMMs. Method 200 may be described below as being executed or performed by a system, for example, host computing device 100 of FIG. 1. Other suitable systems and/or computing devices may be used as well. Method 200 may be implemented in the form of executable instructions stored on at least one machine-readable (e.g. a non-transitory) storage medium of the system and executed by at least one processor of the system (e.g. processor 102). Alternatively or in addition, method 200 may be implemented in the form of electronic circuitry (e.g., hardware). In alternate examples of the present disclosure, one or more blocks of method 200 may be executed substantially concurrently or in a different order than shown in FIG. 2. In alternate examples of the present disclosure, method 200 may include more or less blocks than are shown in FIG. 2. In some examples, one or more of the blocks of method 200 may, at certain times, be ongoing and/or may repeat.

Method 200 may start at block 202 at which point at least one of: a system BIOS (e.g. BIOS 106) or a management controller (e.g. management controller 114) of a host computing device (e.g. host computing device 100) may read metadata (e.g. metadata 108) of an NVDIMM (e.g. NVDIMM 104). At block 204, the BIOS and/or management controller may determine based on the metadata whether there is a mismatch between a system configuration setting of the host computing device (e.g. system configuration information 112) and a system configuration setting associated with the NVDIMM (e.g. system configuration information 110). In various examples, the metadata may indicate at least one of: a platform configuration setting, a memory interleaving setting, NVDIMM set information, platform identification information, or NVDIMM identification information, as described herein.

Figure 3:
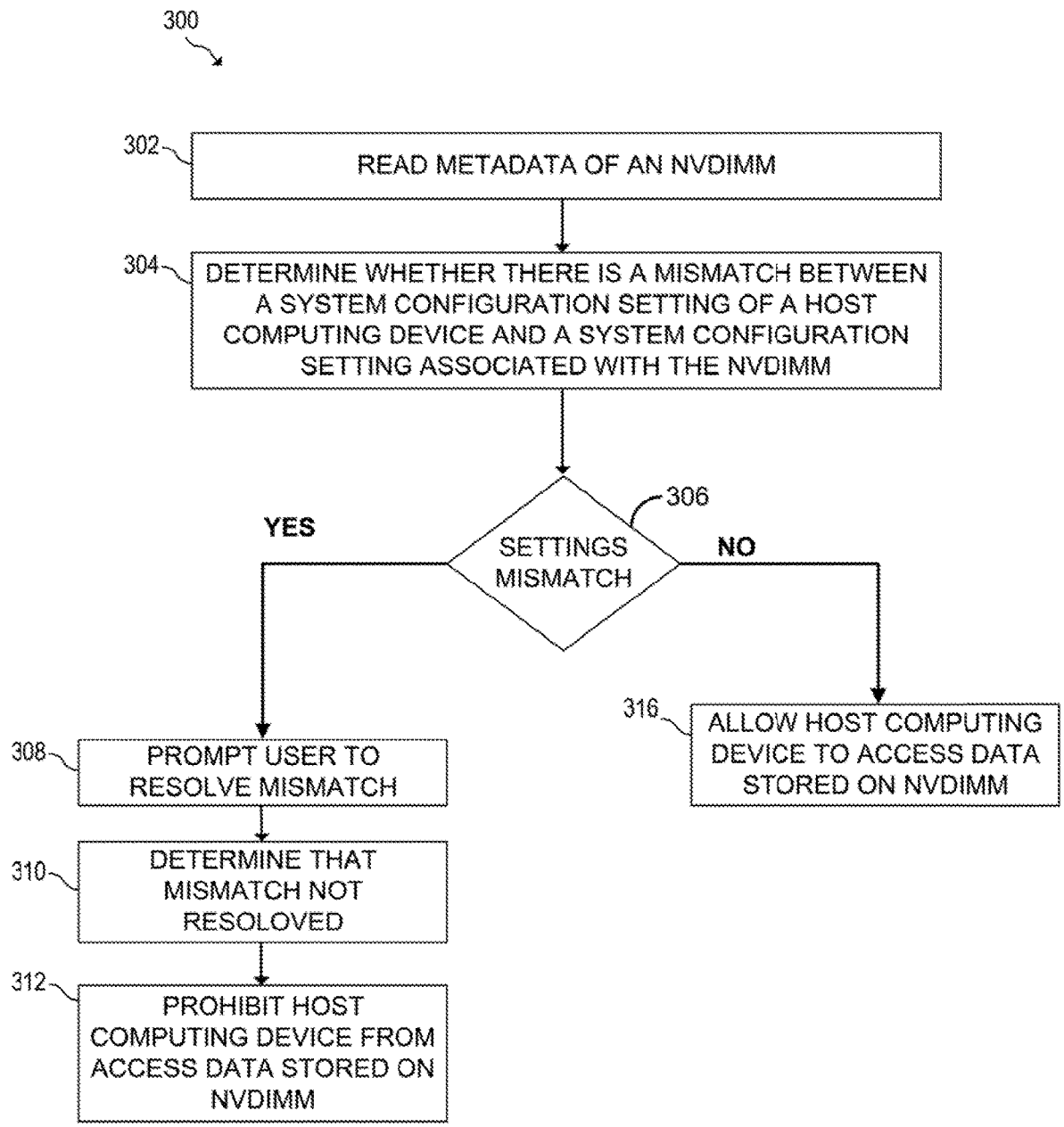
FIG. 3 is a flowchart of another example method for migrating NVDIMMs.

FIG. 3 is a flowchart of an example method 300 for migrating NVDIMMs. Method 300 may be described below as being executed or performed by a system or device, for example, host computing device 100 of FIG. 1. Other suitable systems and/or computing devices may be used as well. Method 300 may be implemented in the form of executable instructions stored on at least one machine-readable storage medium of the system and executed by at least one processor (e.g. processor 102) of the system. Alternatively or in addition, method 300 may be implemented in the form of electronic circuitry (e.g., hardware). In alternate examples of the present disclosure, one or more blocks of method 300 may be executed substantially concurrently or in a different order than shown in FIG. 3. In alternate examples of the present disclosure, method 300 may include more or less blocks than are shown in FIG. 3. In some examples, one or more of the blocks of method 300 may, at certain times, be ongoing and/or may repeat.

Method 300 may start at block 302 at which point at least one of a system BIOS (e.g. BIOS 106) or a management controller (e.g. management controller 114) of a host computing device (e.g. host computing device 100) may read metadata (e.g. metadata 108) of an NVDIMM (e.g. NVDIMM 104). At block 304, the at least one of the BIOS and/or management controller may determine based on the metadata whether there is a mismatch between a system configuration setting of the host computing device (e.g. system configuration information 112) and a system configuration setting associated with the NVDIMM (e.g. system configuration information 110).

If there is a settings mismatch (YES branch 306) of decision box 306, method 300 may proceed to block 308. At block 308, the BIOS may prompt a user of the host computing device that there is a mismatch. In some examples, to prompt the user that there is mismatch, the at least one of the BIOS and/or management controller may prompt the user to resolve the mismatched settings between the system configuration of the host computing device and the settings associated with the NVDIMM.

Responsive to the at least one of the BIOS and/or management controller determining that the mismatch has not resolved (310), the at least one of the BIOS and/or management controller may prohibit the host computing device from accessing data stored on the NVDIMM (312).

Responsive to determining that there is not a settings mismatch (NO branch of decision box 306), method 300 may proceed to block 316. At block 316, the at least one of the BIOS and/or management controller may allow the host computing device to access data stored on the NVDIMM.

Figure 4:
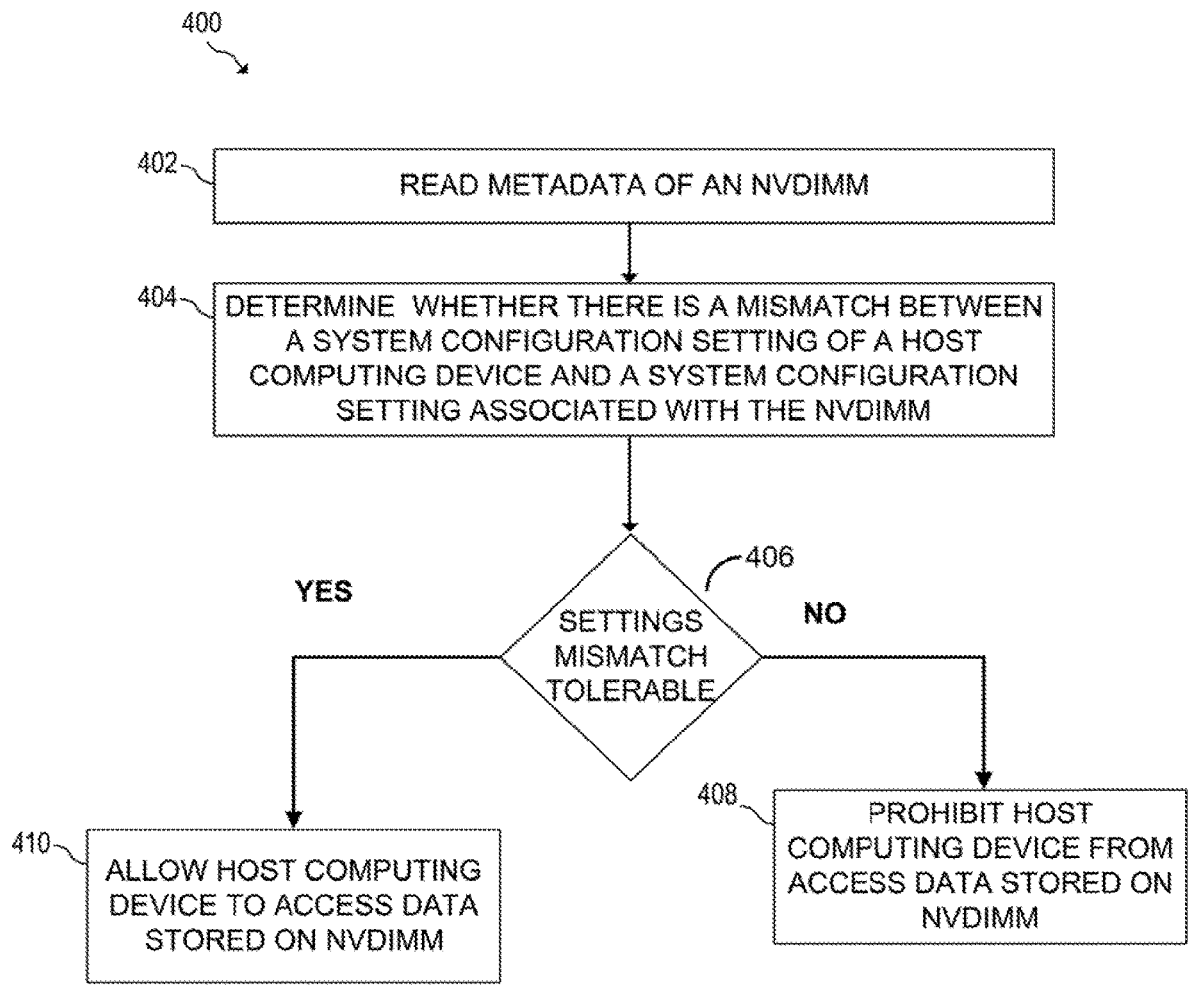
FIG. 4 is a flowchart of another example method for migrating NVDIMMs.

FIG. 4 is a flowchart of an example method 400 for migrating NVDIMMs. Method 400 may be described below as being executed or performed by a system or device, for example, host computing device 100 of FIG. 1. Other suitable systems and/or computing devices may be used as well. Method 400 may be implemented in the form of executable instructions stored on at least one machine-readable storage medium of the system and executed by at least one processor (e.g. processor 102) of the system. Alternatively or in addition, method 400 may be implemented in the form of electronic circuitry (e.g., hardware). In alternate examples of the present disclosure, one or more blocks of method 400 may be executed substantially concurrently or in a different order than shown in FIG. 4. In alternate examples of the present disclosure, method 400 may include more or less blocks than are shown in FIG. 4. In some examples, one or more of the blocks of method 400 may, at certain times, be ongoing and/or may repeat.

Method 400 may start at block 402 at which point at least one of a system BIOS (e.g. BIOS 106) or a management controller (e.g. management controller 114) of a host computing device (e.g. host computing device 100) may read metadata (e.g. metadata 108) of an NVDIMM (e.g. NVDIMM 104). At block 404, the at least one of the BIOS and/or management controller may determine based on the metadata whether there is a mismatch between a system configuration setting of the host computing device (e.g. system configuration information 112) and a system configuration setting associated with the NVDIMM (e.g. system configuration information 110).

If the settings mismatch is tolerable (YES branch 406) of decision box 406, method 400 may proceed to block 410. At block 410, the at least one of the BIOS and/or management controller may allow the host computing device to access data stored on the NVDIMM.

If the settings mismatch is not tolerable (NO branch 406) of decision box 406, method 400 may proceed to block 408. At block 408, the at least one of the BIOS and/or management controller may prohibit the host computing device from accessing data stored on the NVDIMM.

Figure 5:
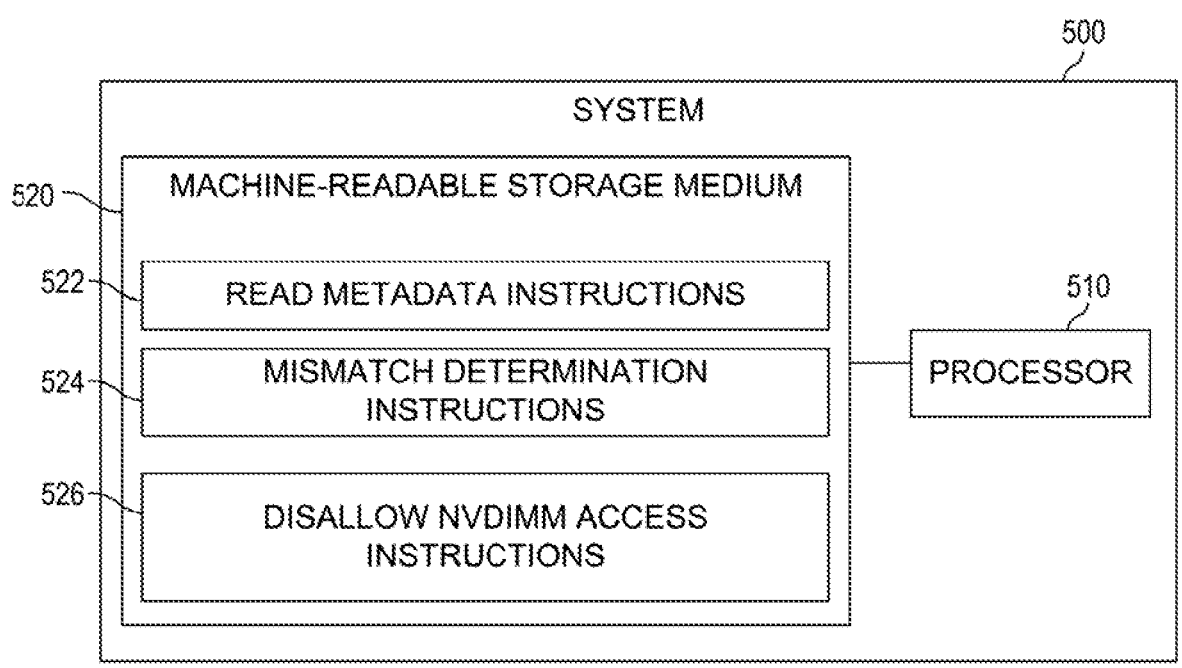
FIG. 5 is a block diagram of another system for migrating NVDIMMs.

FIG. 5 is a block diagram of an example system for migrating NVDIMMs. System 500 may be similar to host computing device 100 of FIG. 1, for example. In the example of FIG. 5, system 500 includes a processor 510 and a machine-readable storage medium 520. Storage medium 520 is non-transitory in various examples. Although the following descriptions refer to a single processor and a single machine-readable storage medium, the descriptions may also apply to a system with multiple processors and multiple machine-readable storage mediums. In such examples, the instructions may be distributed (e.g., stored) across multiple machine-readable storage mediums and the instructions may be distributed (e.g., executed by) across multiple processors.

Processor 510 may be one or more central processing units (CPUs), microprocessors, and/or other hardware devices suitable for retrieval and execution of instructions stored in machine-readable storage medium 520. In the particular examples shown in FIG. 5, processor 510 may fetch, decode, and execute instructions 522, 524, and 526, to allow migration of an NVDIMM. As an alternative or in addition to retrieving and executing instructions, processor 510 may include one or more electronic circuits comprising a number of electronic components for performing the functionality of one or more of the instructions in machine-readable storage medium 520. With respect to the executable instruction representations (e.g., boxes) described and shown herein, it should be understood that part or all of the executable instructions and/or electronic circuits included within one box may, in alternate examples, be included in a different box shown in the figures or in a different box not shown.

Machine-readable storage medium 520 may be any electronic, magnetic, optical, or other physical storage device that stores executable instructions. Thus, machine-readable storage medium 520 may be, for example, Random Access Memory (RAM), an Electrically-Erasable Programmable Read-Only Memory (EEPROM), a storage drive, an optical disc, and the like. Machine-readable storage medium 520 may be disposed within system 500, as shown in FIG. 5. In this situation, the executable instructions may be "installed" on the system 500. Alternatively, machine-readable storage medium 520 may be a portable, external or remote storage medium, for example, that allows system 500 to download the instructions from the portable/external/remote storage medium. In this situation, the executable instructions may be part of an "installation package". As described herein, machine-readable storage medium 520 may be encoded with executable instructions to allow migration of NVDIMMs.

Referring to FIG. 5, application execution instructions 522, when executed by a processor (e.g., 510), may cause system 500 to read, with at least one of a system BIOS (e.g. BIOS 106) or a host management controller of a host computing device, metadata of an NVDIMM coupled to the host computing device. Mismatch determination instructions 524, when executed, may cause processor 510 to determine, based on the metadata, whether there is a mismatch between a system configuration setting of the host computing device and a system configuration setting associated with the NVDIMM. Disallow NVDIMM access instructions 526, when executed, may cause processor 510 to disallow the host computing device (e.g. host computing device 100) from accessing data stored on the NVDIMM.

Figure 6:
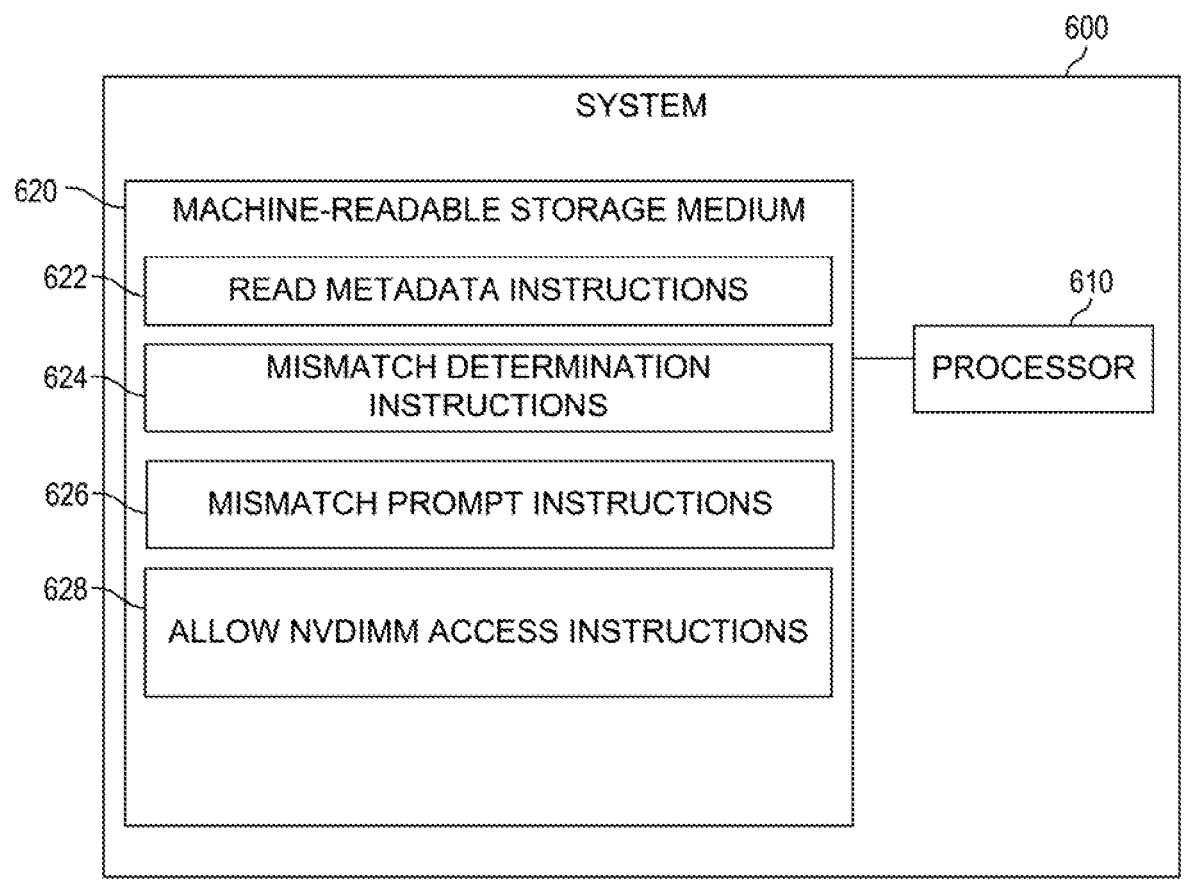
FIG. 6 is a block diagram of an example system for migrating NVDIMMs.

FIG. 6 is a block diagram of another example system for migrating NVDIMMs. System 600 may be similar to host computing device 100 of FIG. 1, for example. In the example of FIG. 6, system 600 includes a processor 610 and a machine-readable storage medium 620. Although the following descriptions refer to a single processor and a single machine-readable storage medium, the descriptions may also apply to a system with multiple processors and multiple machine-readable storage mediums. In such examples, the instructions may be distributed (e.g., stored) across multiple machine-readable storage mediums and the instructions may be distributed (e.g., executed by) across multiple processors.

Processor 610 may be one or more central processing units (CPUs), microprocessors, and/or other hardware devices suitable for retrieval and execution of instructions stored in machine-readable storage medium 620. In the particular examples shown in FIG. 6, processor 610 may fetch, decode, and execute instructions 622, 624, 626, and 628, to allow migration of an NVDIMM. As an alternative or in addition to retrieving and executing instructions, processor 610 may include one or more electronic circuits comprising a number of electronic components for performing the functionality of one or more of the instructions in machine-readable storage medium 620. With respect to the executable instruction representations (e.g., boxes) described and shown herein, it should be understood that part or all of the executable instructions and/or electronic circuits included within one box may, in alternate examples, be included in a different box shown in the figures or in a different box not shown.

Machine-readable storage medium 620 may be any electronic, magnetic, optical, or other physical storage device that stores executable instructions. Thus, machine-readable storage medium 620 may be, for example, Random Access Memory (RAM), an Electrically-Erasable Programmable Read-Only Memory (EEPROM), a storage drive, an optical disc, and the like. Machine-readable storage medium 620 may be disposed within system 600, as shown in FIG. 6. In this situation, the executable instructions may be "installed" on the system 600. Alternatively, machine-readable storage medium 620 may be a portable, external or remote storage medium, for example, that allows system 600 to download the instructions from the portable/external/remote storage medium. In this situation, the executable instructions may be part of an "installation package". As described herein, machine-readable storage medium 620 may be encoded with executable instructions to allow migration of NVDIMMs.

Referring to FIG. 6, application execution instructions 622, when executed by a processor (e.g., 610), may cause system 600 to read, with a system BIOS (e.g. BIOS 106) or a host management controller (e.g. management controller 114) of a host computing device, metadata of an NVDIMM coupled to the host computing device. Mismatch determination instructions 624, when executed, may cause processor 610 to determine, based on the metadata, whether there is a mismatch between a system configuration setting of the host computing device and a system configuration setting associated with the NVDIMM. Mismatch prompt instructions 626, when executed, may cause processor 610 to prompt, with at least one of the BIOS and/or management controller, a user of the host computing device that there is a mismatch. Allow NVDIMM access instructions 628, when executed, may cause processor 610 to, responsive to resolving the mismatch, allow the host computing device (e.g. host computing device 100) to access data stored on the NVDIMM.

Figure 7:
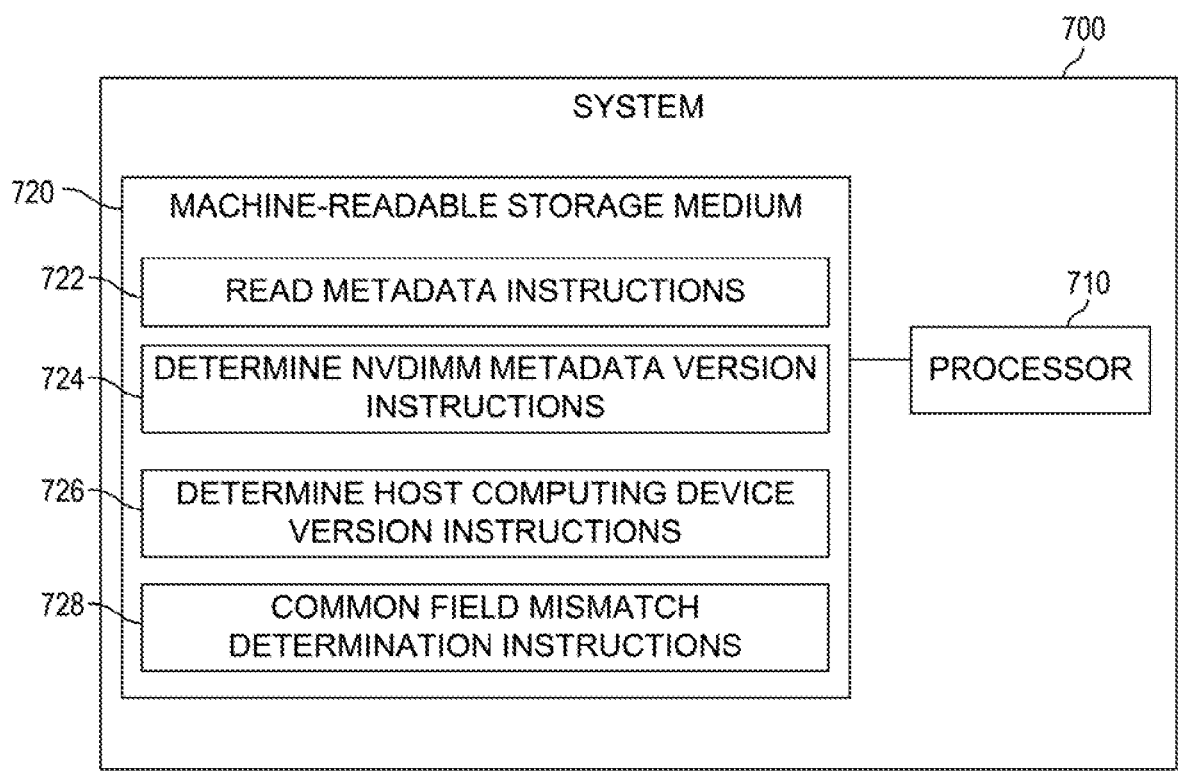
FIG. 7 is a block diagram of another example system for migrating NVDIMMs.

FIG. 7 is a block diagram of another example system for migrating NVDIMMs. System 700 may be similar to host computing device 100 of FIG. 1, for example. In the example of FIG. 7, system 700 includes a processor 710 and a machine-readable storage medium 720. Although the following descriptions refer to a single processor and a single machine-readable storage medium, the descriptions may also apply to a system with multiple processors and multiple machine-readable storage mediums. In such examples, the instructions may be distributed (e.g., stored) across multiple machine-readable storage mediums and the instructions may be distributed (e.g., executed by) across multiple processors.

Processor 710 may be one or more central processing units (CPUs), microprocessors, and/or other hardware devices suitable for retrieval and execution of instructions stored in machine-readable storage medium 720. In the particular examples shown in FIG. 7, processor 710 may fetch, decode, and execute instructions 722, 724, 726, and 728, to allow migration of NVDIMMs. As an alternative or in addition to retrieving and executing instructions, processor 710 may include one or more electronic circuits comprising a number of electronic components for performing the functionality of one or more of the instructions in machine-readable storage medium 720. With respect to the executable instruction representations (e.g., boxes) described and shown herein, it should be understood that part or all of the executable instructions and/or electronic circuits included within one box may, in alternate examples, be included in a different box shown in the figures or in a different box not shown.

Machine-readable storage medium 720 may be any electronic, magnetic, optical, or other physical storage device that stores executable instructions. Thus, machine-readable storage medium 720 may be, for example, Random Access Memory (RAM), an Electrically-Erasable Programmable Read-Only Memory (EEPROM), a storage drive, an optical disc, and the like. Machine-readable storage medium 720 may be disposed within system 700, as shown in FIG. 7. In this situation, the executable instructions may be "installed" on the system 700. Alternatively, machine-readable storage medium 720 may be a portable, external or remote storage medium, for example, that allows system 700 to download the instructions from the portable/external/remote storage medium. In this situation, the executable instructions may be part of an "installation package". As described herein, machine-readable storage medium 720 may be encoded with executable instructions to allow migration of NVDIMMs.

Referring to FIG. 7, application execution instructions 722, when executed by a processor (e.g., 710), may cause system 700 to read, with a system BIOS (e.g. BIOS 107) or a host management controller (e.g. management controller 114) of a host computing device, metadata of an NVDIMM coupled to the host computing device.

Determine first NVDIMM metadata version instructions 724, when executed, may cause processor 710 to determine, with at least one of the BIOS or the management controller, a first version of the metadata of the NVDIMM. Determine second NVDIMM metadata version instructions 726, when executed, may cause processor 710 to determine, with the at least one of the BIOS or the management controller, a second version of metadata supported by the NVDIMM.

Common field mismatch determination instructions 728, when executed, may cause processor 710 to determine, based on the metadata, whether there is a mismatch between a system configuration setting of the host computing device and a system configuration setting associated with the NVDIMM. To determine whether there is a mismatch in the settings, common field mismatch determination instructions 728 may cause processor 710 to determine whether there is a mismatch based on fields of the NVDIMM metadata that are common to the first version and the second version of the metadata.

The invention claimed is:

1. A method comprising:
   reading, by at least one of a system basic input output system (BIOS) or a management controller of a host computing device, metadata of a non-volatile dual inline memory module (NVDIMM);
   determining, based on the metadata, whether there is a mismatch between a system configuration setting of the host computing device and a system configuration setting associated with the NVDIMM; and
   in response to determining presence of the mismatch:
      determining, by the at least one of the system BIOS or the management controller, whether the NVDIMM is useable in the host computing device when a field of the system configuration setting of the host computing device is mismatched with a corresponding field of the system configuration setting associated with the NVDIMM, and
      in response to determining that the NVDIMM is useable in the host computing device even though the field of the system configuration setting of the host computing device is mismatched with the corresponding field of the system configuration setting associated with the NVDIMM, permitting access of the NVDIMM by the host computing device.

2. The method of claim 1, comprising:
   responsive to determining the presence of the mismatch:
      prompting a user of the host computing device regarding the mismatch; and
   responsive to detecting a resolution of the mismatch:
      allowing the host computing device to access data stored on the NVDIMM.

3. The method of claim 2, wherein prompting the user regarding the mismatch comprises:
   prompting the user to resolve the mismatch between the system configuration setting of the host computing device and the system configuration setting associated with the NVDIMM.

4. The method of claim 1, comprising:
   responsive to determining that the mismatch is not present:
      allowing the host computing device to access data stored on the NVDIMM.

5. The method of claim 1, wherein the metadata indicates at least one of:
   a platform configuration setting, a memory interleaving setting, NVDIMM set information, platform identification information, or NVDIMM identification information.

6. A host computing device comprising:
   a processor;
   a non-volatile dual inline memory module (NVDIMM) comprising metadata including system configuration information associated with the NVDIMM; and
   a basic input output system (BIOS) comprising system configuration information of the host computing device, the system configuration information of the host computing device specifying a processor type of the processor, the BIOS to:
      determine whether there is a mismatch between the processor type specified by the system configuration information of the host computing device and a processor type specified by the system configuration information included in the metadata; and
      prohibit the host computing device from accessing data on the NVDIMM responsive to the processor type specified by the system configuration information of the host computing device being mismatched with the processor type specified by the system configuration information included in the metadata.

7. The host computing device of claim 6, wherein the BIOS is to:
   responsive to determining presence of the mismatch:
      prompt a user of the host computing device regarding the mismatch;
   responsive to resolving detecting a resolution of the mismatch:
      allow the host computing device to access the data on the NVDIMM; and
   responsive to determining that the mismatch is not present:
      allow the host computing device to access the data on the NVDIMM.

8. The host computing device of claim 6, wherein the metadata indicates at least one of:
   a platform configuration setting, a memory interleaving setting, NVDIMM set information, platform identification information, or NVDIMM identification information.

9. The host computing device of claim 6, wherein the system configuration information of the host computing device specifies a memory address scrambling used in the host computing device, and the BIOS is to:
   prohibit the host computing device from accessing the data on the NVDIMM responsive to the memory address scrambling specified by the configuration information of the host computing device being mismatched with a memory address scrambling specified by the configuration information included in the metadata.

10. The host computing device of claim 6, wherein the BIOS is to:
   determine a first version of the metadata of the NVDIMM;
   determine a second version of the metadata supported by the NVDIMM; and
   identify fields of the metadata that are common to the first version of the metadata and the second version of the metadata, the identified fields comprising a field specifying the processor type of the processor.

11. A non-transitory machine-readable storage medium comprising instructions that when executed cause at least one of a system BIOS (basic input output system) or a management controller in a host computing device to:
   read metadata of a non-volatile dual inline memory module (NVDIMM);
   determine a first version of the metadata of the NVDIMM;
   determine a second version of the metadata supported by the NVDIMM;
   identify fields of the metadata that are common to the first version of the metadata and the second version of the metadata;
   determine whether there is a mismatch between a system configuration setting of the host computing device and a system configuration setting associated with the NVDIMM based on the identified fields of the metadata that are common to the first version of the metadata and the second version of the metadata; and
   responsive to determining presence of the mismatch, disallow the host computing device from accessing data stored on the NVDIMM.

12. The non-transitory machine-readable storage medium of claim 11, wherein the instructions when executed cause the the at least one of the system BIOS or the management controller to:
   responsive to determining the presence of the mismatch:
      prompt a user of the host computing device regarding the mismatch; and
   responsive to detecting a resolution of the mismatch:
      allow the host computing device to access the data stored on the NVDIMM.

13. The method of claim 1, further comprising:
   responsive to determining the presence of the mismatch:
      in response to determining that the NVDIMM is not useable in the host computing device due to the field of the system configuration setting of the host computing device being mismatched with the corresponding field of the system configuration setting associated with the NVDIMM, prohibiting the host computing device from accessing the NVDIMM.

14. The method of claim 13, wherein the field of the system configuration setting of the host computing device indicates a processor type of a processor in the host computing device, the method comprising:
   determining that the NVDIMM is not useable in the host computing device due to the processor type indicated by the field of the system configuration setting of the host computing device being mismatched with a processor type indicated by the corresponding field of the system configuration setting associated with the NVDIMM.

15. The method of claim 13, wherein the field of the system configuration setting of the host computing device indicates a memory address scrambling used in the host computing device, the method comprising:
   determining that the NVDIMM is not useable in the host computing device due to the memory address scrambling indicated by the field of the system configuration setting of the host computing device being mismatched with a memory address scrambling indicated by the corresponding field of the system configuration setting associated with the NVDIMM.

16. The non-transitory machine-readable storage medium of claim 11, wherein the mismatch is between a processor type specified by the system configuration setting of the host computing device and a processor type specified by the system configuration setting associated with the NVDIMM.

17. The non-transitory machine-readable storage medium of claim 11, wherein the mismatch is between a memory address scrambling specified by the system configuration setting of the host computing device and a processor type specified by the system configuration setting associated with the NVDIMM.

* * * * *